(12) United States Patent
Xiao et al.

(10) Patent No.: US 8,581,366 B2
(45) Date of Patent: Nov. 12, 2013

(54) METHOD AND SYSTEM FOR FORMING CONDUCTIVE BUMPING WITH COPPER INTERCONNECTION

(71) Applicants: De Yuan Xiao, Shanghai (CN); Guo Qing Chen, Shanghai (CN)

(72) Inventors: De Yuan Xiao, Shanghai (CN); Guo Qing Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/645,448

(22) Filed: Oct. 4, 2012

(65) Prior Publication Data

US 2013/0029483 A1      Jan. 31, 2013

Related U.S. Application Data

(60) Continuation of application No. 13/269,538, filed on Oct. 7, 2011, now Pat. No. 8,293,635, which is a division of application No. 12/258,956, filed on Oct. 27, 2008, now Pat. No. 8,053,907.

(30) Foreign Application Priority Data

Jul. 15, 2008    (CN) .......................... 2008 1 0040739

(51) Int. Cl.
*H01L 21/44*      (2006.01)

(52) U.S. Cl.
USPC ...... 257/612; 438/108; 438/109; 257/E23.02; 257/778; 257/781

(58) Field of Classification Search
USPC ................... 257/E25.018, E21.499, E23.001, 257/E23.02, 666, 669, 676, 686, 692, 693, 257/696, 685, 777–782; 438/108, 109, 612; 361/760
See application file for complete search history.

(56) References Cited

U.S. PATENT DOCUMENTS 5,510,651 A * 4/1996 Maniar et al. ................. 257/751
5,739,579 A    4/1998 Chiang et al.
(Continued)

FOREIGN PATENT DOCUMENTS

CN    1269607 A    10/2000
CN    1399335 A     2/2003
(Continued)

OTHER PUBLICATIONS

Final Office Action for U.S. Appl. No. 12/258,956, mailed on Feb. 28, 2011, 11 pages.
(Continued)

*Primary Examiner* — Chris Chu
(74) *Attorney, Agent, or Firm* — Kilpatrick Townsend and Stockton LLP

(57) ABSTRACT

A method for making an integrated circuit system with one or more copper interconnects that are conductively connected with a substrate includes depositing and patterning a first dielectric layer to form a first via and filling the first via through the first dielectric layer with a copper material. The method further includes depositing and patterning a second dielectric layer in contact with the first dielectric layer to form a second via, and forming a diffusion barrier layer. Moreover, the method includes depositing and patterning a photoresist layer on the diffusion barrier layer, and at least partially filling the second via with a metal material. The metal material is conductively connected to the copper material through the diffusion barrier layer. The method further includes removing the photoresist and the diffusion barrier layer not covering by the metal material.

11 Claims, 8 Drawing Sheets

(56) References Cited

U.S. PATENT DOCUMENTS

| | | |
|---|---|---|
| 5,904,556 A | 5/1999 | Suzuki et al. |
| 6,133,136 A | 10/2000 | Edelstein |
| 6,197,688 B1 | 3/2001 | Simpson |
| 6,218,302 B1 | 4/2001 | Braeckelmann et al. |
| 6,320,263 B1 * | 11/2001 | Lopatin et al. ............... 257/758 |
| 6,462,416 B1 * | 10/2002 | Marathe et al. ............... 257/751 |
| 6,476,491 B2 | 11/2002 | Harada et al. |
| 6,559,548 B1 | 5/2003 | Matsunaga et al. |
| 6,566,171 B1 | 5/2003 | Liu et al. |
| 6,583,364 B1 | 6/2003 | Kurita et al. |
| 6,689,680 B2 * | 2/2004 | Greer ........................... 438/614 |
| 6,727,590 B2 | 4/2004 | Izumitani et al. |
| 6,727,593 B2 * | 4/2004 | Toyoda et al. ............... 257/762 |
| 6,806,551 B2 | 10/2004 | Liu et al. |
| 6,828,677 B2 * | 12/2004 | Yap et al. ..................... 257/737 |
| 6,909,191 B2 | 6/2005 | Hatano et al. |
| 7,144,804 B2 | 12/2006 | Minamihaba et al. |
| 7,199,042 B2 | 4/2007 | Ozawa |
| 7,230,338 B2 | 6/2007 | Yuzawa et al. |
| 7,638,406 B2 | 12/2009 | Edelstein et al. |
| 7,642,647 B2 * | 1/2010 | Minda ........................... 257/738 |
| 7,691,697 B2 | 4/2010 | Itou |
| 8,053,907 B2 | 11/2011 | Xiao et al. |
| 8,076,238 B2 | 12/2011 | Hosseini et al. |
| 8,293,635 B2 | 10/2012 | Xiao et al. |
| 2002/0000665 A1 * | 1/2002 | Barr et al. ..................... 257/758 |
| 2002/0163083 A1 * | 11/2002 | Hatano et al. ................ 257/762 |
| 2005/0006688 A1 * | 1/2005 | Solo De Zaldivar ......... 257/306 |
| 2005/0224984 A1 * | 10/2005 | Hortaleza et al. ............ 257/762 |
| 2008/0029894 A1 | 2/2008 | Wang |

FOREIGN PATENT DOCUMENTS

| | | |
|---|---|---|
| CN | 1459844 A | 12/2003 |
| CN | 101030565 A | 9/2007 |
| CN | 101202244 A | 6/2008 |

OTHER PUBLICATIONS

Non-Final Office Action for U.S. Appl. No. 12/258,956, mailed on Nov. 19, 2010, 10 pages.
Notice of Allowance for U.S. Appl. No. 13/269,538, mailed on Jul. 23, 2012, 8 pages.
Notice of Allowance for U.S. Appl. No. 12/258,956, mailed on Aug. 8, 2011, 8 pages.
Office Action of Chinese Application No. 200810040739.X, dated Feb. 16, 2011, 6 pages total (English translation not included).
Office Action of Chinese Application No. 200810040739.X, dated Sep. 10, 2010, 6 pages total (English translation not included).
Requirement for Restriction/Election for U.S. Appl. No. 12/258,956, mailed on Sep. 3, 2010, 5 pages.

* cited by examiner

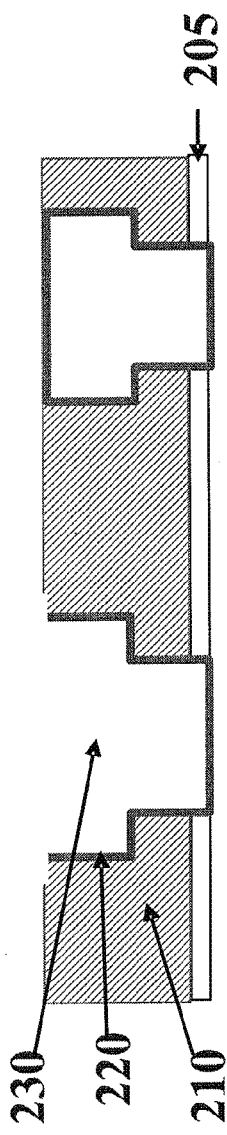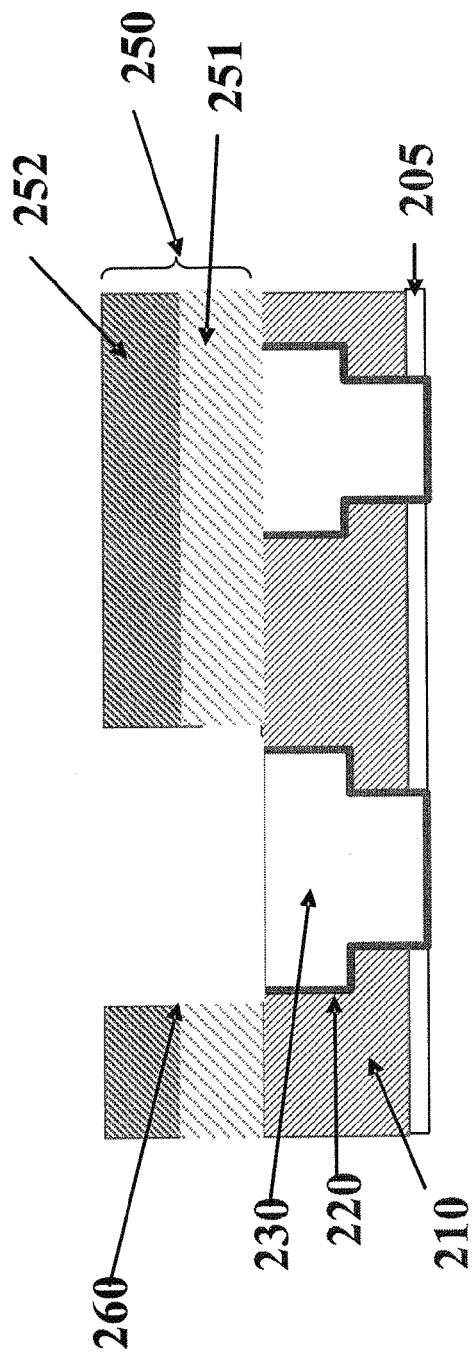

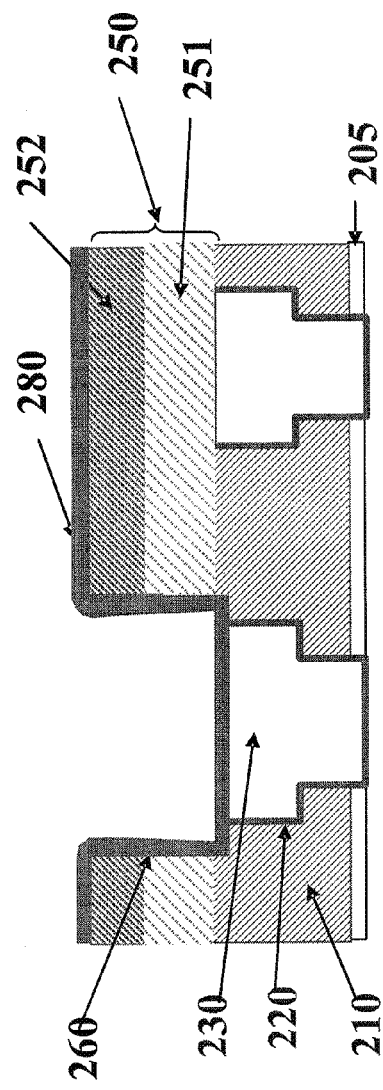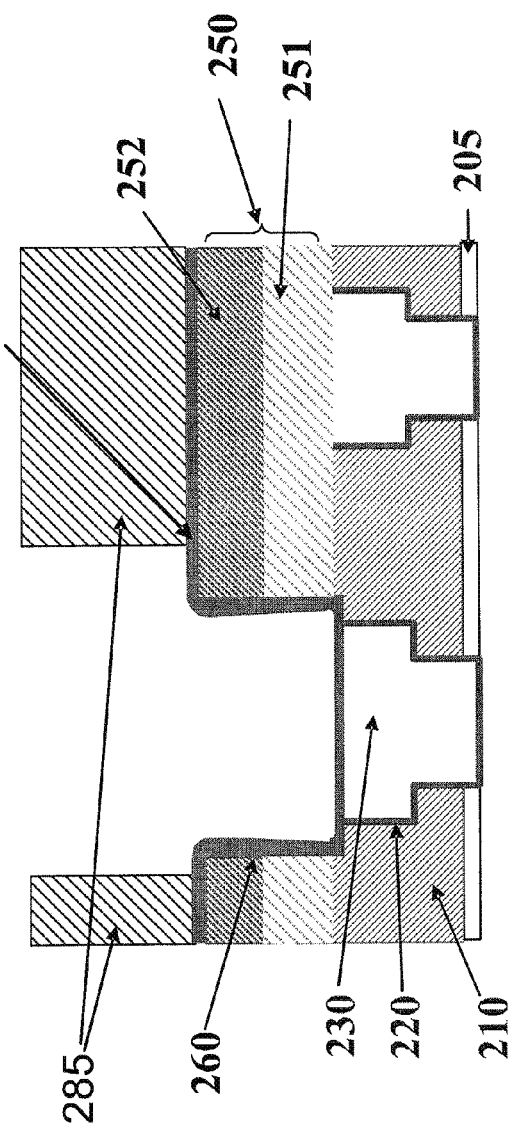
Fig. 4C
Fig. 4D

METHOD AND SYSTEM FOR FORMING CONDUCTIVE BUMPING WITH COPPER INTERCONNECTION

CROSS-REFERENCES TO RELATED APPLICATIONS

The present application is a continuation application of U.S. application Ser. No. 13/269,538, filed Oct. 7, 2011, which is a divisional application of U.S. application Ser. No. 12/258,956, filed Oct. 27, 2008, now U.S. Pat. No. 8,053,907. Both of these applications are commonly owned, and the entire content of these applications is incorporated herein by reference for all purposes. The U.S. application Ser. No. 12/258,956 claims the benefit and priority under 35 U.S.C. 119 of Chinese Application No. 200810040739X, filed Jul. 15, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and system for forming conductive bumping with copper interconnection. Merely by way of example, the invention has been applied to flip chip lead free bumping process for the manufacture of integrated circuit with one or more copper interconnects. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example is that for increasing packing density in IC, copper/low-k dielectric materials have been rapidly replacing conventional aluminum-alloy/$SiO_2$-based interconnects in integrated circuits to reduce the interconnect delays for faster devices with low power consumption and cost.

Currently for copper interconnect chips, aluminum alloy pad is still widely used. The aluminum alloy pad is easy for wire bonding as an interconnect method and the aluminum pad can function as a fuse. However, the disadvantage of using aluminum pad also can be seen by its high resistance compared to copper, additional mask needed to pattern the bond pad to overcome problems related to the aluminum chemical-mechanical planarization (CMP) process, and problems in controlling cross contamination between aluminum and copper.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and system for forming conductive bumping with copper interconnection. Merely by way of example, the invention has been applied to flip chip lead free bumping process for the manufacture of integrated circuit with one or more copper interconnects. But it would be recognized that the invention has a much broader range of applicability.

According to an embodiment of the present invention, a method for making an integrated circuit system with one or more copper interconnects is provided, the one or more copper interconnects are conductively connected with a substrate. The method includes depositing and patterning a first dielectric layer to form a first via and filling the first via through the first dielectric layer with a copper material. The method further includes depositing and patterning a second dielectric layer in contact with the first dielectric layer to form a second via, and forming a diffusion barrier layer. The diffusion barrier layer at least partially fills the second via through the second dielectric layer. At least a first part of the diffusion barrier layer in direct contact with the copper material, and at least a second part of the diffusion barrier layer in direct contact with the second dielectric layer. Moreover, the method includes depositing and patterning a photoresist layer on the diffusion barrier layer, and at least partially filling the second via with a metal material. The metal material is conductively connected to the copper material through the diffusion barrier layer. The method further includes removing the photoresist and the diffusion barrier layer not covering by the metal material. Additionally, the method includes conductively connecting the metal material with the substrate.

According to another embodiment of the present invention, an integrated circuit system with one or more copper interconnects is provided. The one or more copper interconnects are in conductive contact with a substrate. The integrated circuit system includes a first dielectric layer, and a copper material filling a first via through the first dielectric layer. Additionally, the integrated circuit system includes a second dielectric layer in contact with the first dielectric layer, and a diffusion barrier layer. The diffusion barrier layer at least partially fills a second via through the second dielectric layer. At least a first part of the diffusion barrier layer is in direct contact with the copper material, and at least a second part of the diffusion barrier layer is in direct contact with the second dielectric layer. Moreover, the integrated circuit system includes a gold material at least partially filling the second via. The gold material is conductively connected with the copper material through the diffusion barrier layer and conductively connected with a substrate.

Many benefits are achieved by way of the present invention over conventional techniques. For example, in lead free flip chip gold bumping process, the present technique provides a replacement of the aluminum wire bonding by gold bumping. In another example, the present technique provides a full copper interconnection for the gold bumping process without Al material for the whole process. Some embodiments of the present invention provide an integrated circuit system with one or more copper interconnects without Al material. Certain embodiments of the present invention provide a process that is compatible with conventional process technology. Moreover, the process does not require an additional mask for patterning the copper bond pad. Some embodiments of the present invention utilize copper CMP process to automatically patterning the copper bond pad. Certain embodiments of the present invention reduce the possibility of the cross contamination between aluminum and copper. Some embodiments of the present invention improve the speed of the whole chip. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 4A-4G are simplified diagrams showing the processing steps to make bond pads for an integrated circuit system with one or more copper interconnects and to form conductive contact with a substrate through a flip chip bumping according to some embodiments of the present invention.

DETAILED DESCRIPTION OF THE INVENTION

The present invention is directed to integrated circuits and their processing for the manufacture of semiconductor devices. More particularly, the invention provides a method and system for forming conductive bumping with copper interconnection. Merely by way of example, the invention has been applied to flip chip lead free bumping process for the manufacture of integrated circuit with one or more copper interconnects. But it would be recognized that the invention has a much broader range of applicability.

Figure 1:
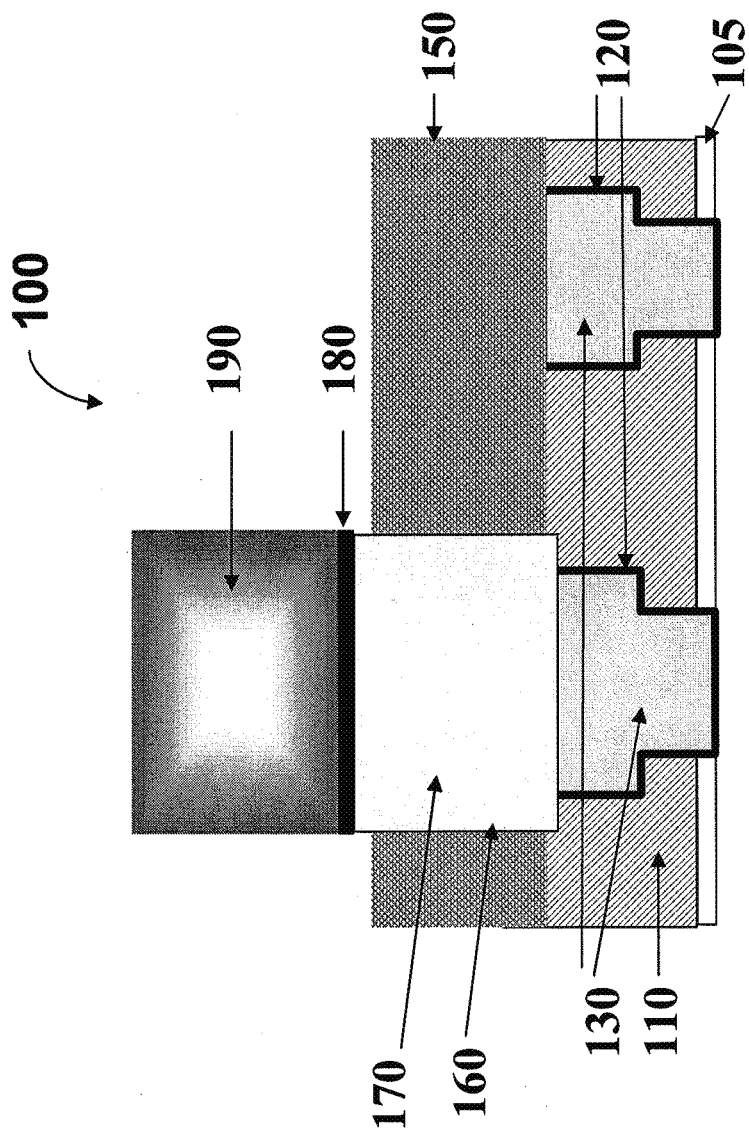
FIG. 1 is a simplified diagram of a conventional integrated circuit system with copper interconnects.

Conventionally, aluminum (Al) pad is still widely used in the copper interconnect chips. The main purpose of implementation of Al pad in copper interconnection is for accommodating the wire bonding. FIG. 1 shows a simplified diagram of a conventional integrated circuit 100 with cooper interconnects and Al pad on top of copper material for wire bonding. The first dielectric layer 110 is a low-k dielectric material that can be fluorinated silica glass (FSG) deposited on top of a nitride layer 105. Copper 130 fills at least partially a first via 120, and the first via 120 is patterned through the first dielectric layer 110. On the first dielectric layer 110, a second dielectric layer 150 is deposited and patterned to provide a second via 160. Aluminum material is directly added on top of copper material 130 in the second via 160 and contact with copper material 130 to form Al pad 170. Then a diffusion barrier layer 180 is deposited on Al pad 170. On the barrier layer 180, gold material is added to form a gold pad 190. In such an integrated circuit, there are several significant disadvantages for using Al pad 170. First of all, aluminum has high resistance compared to copper. Secondly, due to the difficulties in the Al CMP process, additional mask often is required in order to pattern the bond pad. Further, it is difficult to control the cross contamination between Al pad 170 and copper interconnects 130.

Figure 2:
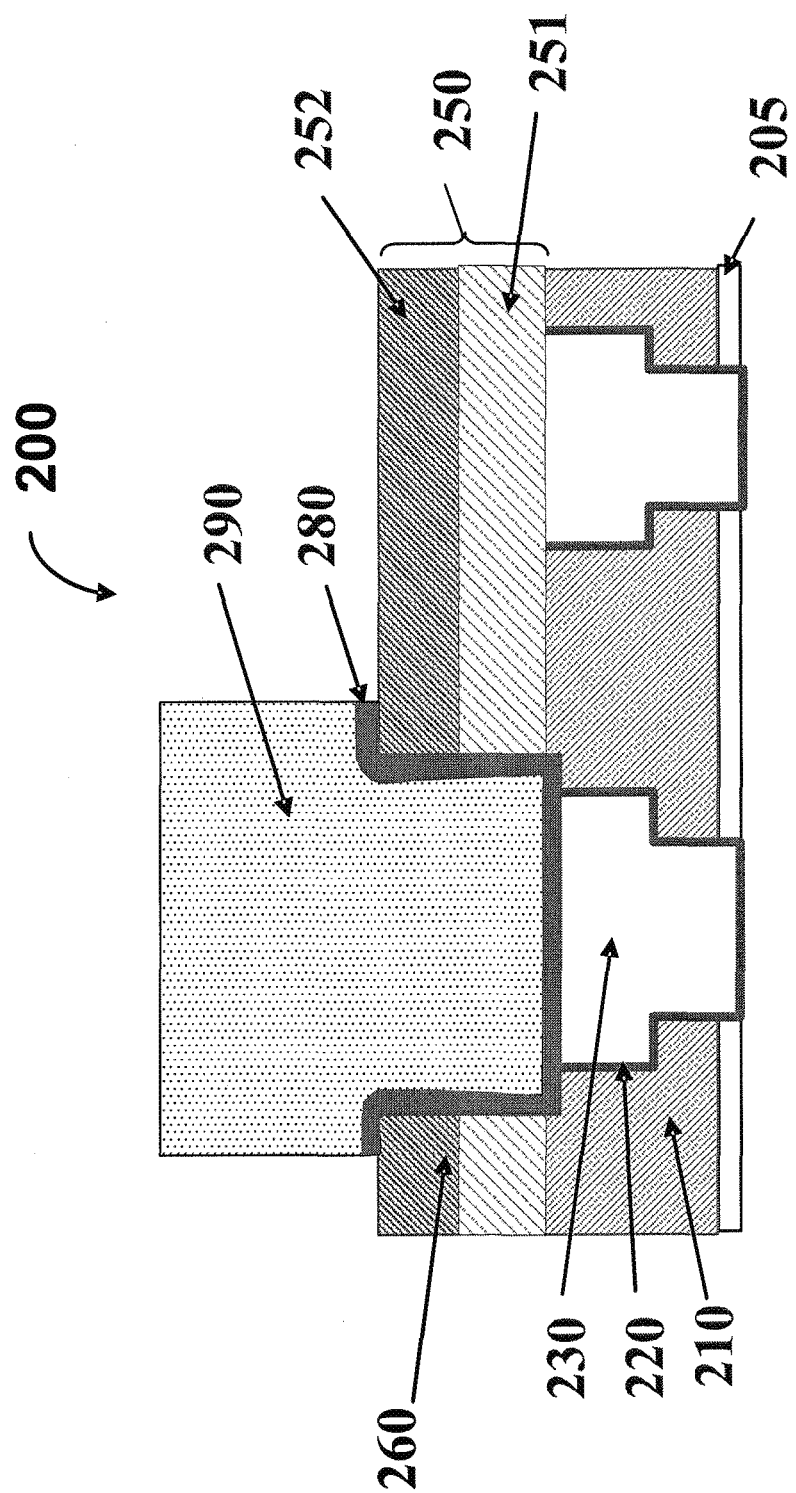
FIG. 2 is a simplified diagram of an integrated circuit system with copper interconnects according to an embodiment of the present invention.

FIG. 2 is a simplified diagram of an integrated circuit system with one or more copper interconnects according to one embodiment of the present invention. This diagram is merely an example, which should not unduly limit the scope of the claims. One of ordinary skill in the art would recognize many variations, alternatives, and modifications. The integrated circuits with one or more copper interconnects 200 includes a nitride layer 205, a dielectric layer 210, via 220, copper interconnects 230, and a dielectric layer 250, a via 260, a diffusion barrier layer 280, a gold pad 290.

The nitride layer 205 may be located on a substrate. For example, the nitride layer 205 is a passivation layer for one or more devices. In another example, the nitride layer 205 may be replaced by other type of dielectric materials. According to some embodiments of the invention, the nitride layer 205 may be replaced by oxide and/or oxynitride.

On top of the nitride layer 205, the dielectric layer 210 is deposited. In one embodiment, the dielectric layer 210 includes a low-k dielectric material. In an exemplary embodiment, the low-k dielectric material is fluorinated silica glass (FSG). In another exemplary embodiment, the low-k dielectric material is carbonized silicon dioxide.

The dielectric layer 210 is patterned to provide a via 220. For example, the via 220 extends from the bottom surface of the dielectric layer 210 to the top surface of the dielectric layer 210. In another example, via 220 has a predetermined shape. In one embodiment, via 220 has a cross-section varying with the depth of the via. In another embodiment, the side surface of via 220 includes one or more steps.

As shown in FIG. 2, the via 220 is filled with copper material to form one or more copper interconnects 230. The surface of top copper interconnects 230 and the surrounding dielectric layer 210 is planarized, on which the dielectric layer 250 is deposited. In one embodiment, the dielectric layer 250 includes a sub-layer 251 and a sub-layer 252 sequentially formed over sub-layer 251. In one example embodiment, the sub-layer 251 is a passivation oxide. In another example embodiment, the sub-layer 251 is silicon-rich oxide. In yet another example embodiment, the sub-layer 252 is selected from a group consisting of passivation SiON, Nitride, BCB (bisbenzocyclobutene), and polyimide. In an embodiment, BCB is used for the sub-layer 252 due to its low dielectric constant of 2.7 and low water absorption.

The dielectric layer 250 is patterned to form a via 260. The via 260 is aligned to and connected with at least one copper interconnect 230. For example, via 260 extends from the top surface of the copper interconnect 230 to the top surface of the dielectric layer 250. In another example, via 260 has a predetermined shape. In one embodiment, the cross-section dimension of via 260 at the bottom is wider than the cross-section dimension of copper interconnect 230 at the top. In another embodiment, via 260 has a cross-section varying with the depth of the via.

As shown in FIG. 2, a diffusion barrier layer 280 overlays the surfaces of the via 260 including the sides and the bottom of the via. The diffusion barrier layer 280 extends outside the upper edge of via 260 to cover additional surface region of the dielectric layer 250 surrounding via 260. In one embodiment, the diffusion barrier layer 280 includes a metallic material selected from a group consisting of Ta, TaN, TaN/Ta, TiN, TiSiN, W, TiW, or WN. In another embodiment, a gold seed layer is included in the diffusion barrier layer 280.

On top of the diffusion barrier layer 280, gold material is plated to form a gold pad 290. In one embodiment, the gold pad 290 forms a conductive contact to the copper interconnects 230 at the bottom of via 260 through only the diffusion barrier layer 280. In another embodiment, the gold pad 290 overlaying the diffusion barrier layer 280 has a larger cross-section dimension than that of via 260. In yet another embodiment, the gold pad 290 has an extended portion vertically above the surface of the dielectric layer 250 with a certain height. The extended portion of the gold pad 290 is re-shaped to form a gold bump. The gold bump can be used to form a conductive contact with a substrate through a flip chip gold bumping process.

As described above and further emphasized here, FIG. 2 is merely an example, which should not unduly limit the scope of the claims. One of ordinary skill in the art would recognize many variations, alternatives, and modifications. For example, gold material has been shown to be used in the pad for flip chip bumping contact with a substrate. But there can be many alternatives for the pad material. In one embodiment, the pad material can be copper, nickel, or silver. In another embodiment, the substrate to which the integrated circuits with one or more copper interconnects are conductively contacted through the flip chip bumping process can be, but not limited to, a PCB board, an interposer, or a glass substrate.

Figure 3:
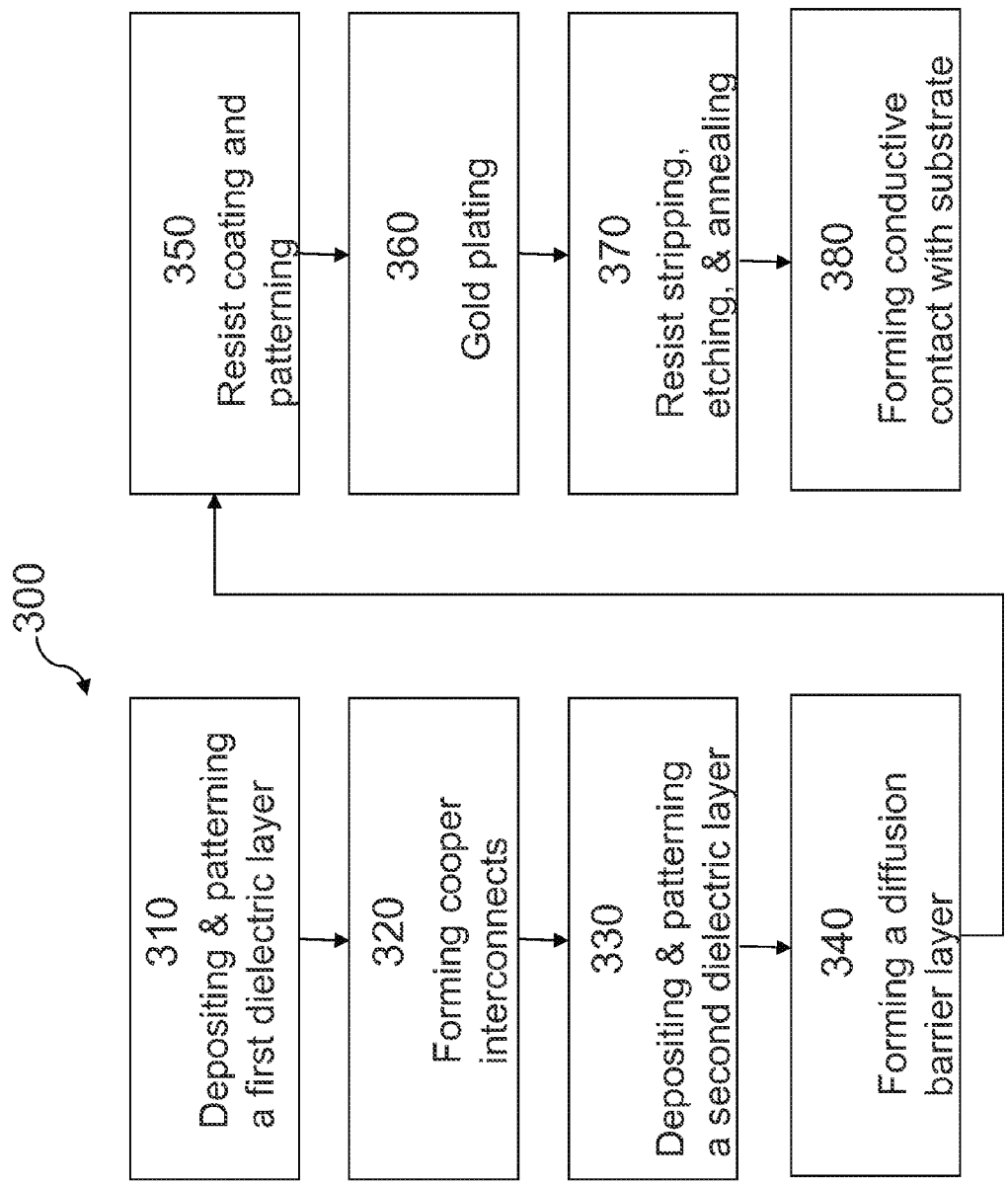
FIG. 3 is a simplified method for making an integrated circuit system with one or more copper interconnects according to an embodiment of the present invention.

FIG. 3 is a simplified method for making an integrated circuit system with one or more copper interconnects according to an embodiment of the present invention. This diagram is merely an example, which should not unduly limit the scope of the claims. One of ordinary skill in the art would recognize many variations, alternatives, and modifications. The method 300 includes a process 310 for depositing and patterning a dielectric layer, a process 320 for forming copper interconnects, a process 330 for depositing and patterning another dielectric layer, a process 340 for forming a diffusion barrier layer, a process 350 for resist coating and patterning, a process 360 for gold plating, a process 370 for resist stripping, etching, and annealing, and a process 380 for forming conductive contact with substrate. Further details of these processes are found throughout the present specification and more particularly below.

At the process 310, a dielectric layer is deposited on top of a nitride layer and patterned. FIG. 4A is a simplified diagram showing the process 310 for depositing and patterning a dielectric layer for forming conductive bumping with copper interconnection according to an embodiment of the present invention. This diagram is merely an example, which should not unduly limit the scope of the claims. One of ordinary skill in the art would recognize many variations, alternatives, and modifications. A dielectric layer 210 is deposited on top of a nitride layer 205 and patterned.

For example, the dielectric layer 210 is a dielectric material with low dielectric constant (k). In one embodiment, the low-k dielectric is fluorinated silica glass (FSG). In another embodiment, the low-k dielectric is carbonized silicon dioxide. The deposition of the dielectric layer 210 can be performed by various techniques. For example, the dielectric layer is formed by a chemical vapor deposition process and/or a sputtering process. In another example, the chemical vapor deposition process is selected from plasma-assisted chemical vapor deposition and low-pressure chemical vapor deposition.

The patterning of the dielectric layer 210 is accomplished by using a photoresist layer according to an embodiment of the present invention. For example, the photoresist layer is deposited and then exposed with a photolithography mask. In one embodiment, the photoresist layer is a positive resist. In another embodiment, the photoresist is a negative resist. The patterning of the dielectric layer 210 is further performed by etching and resist stripping. The etching and the resist stripping lead to the formation of one or more vias 220 on the dielectric layer 210 through the thickness of the dielectric layer. The vias 220, depending on the patterning process based on the circuit design requirement, can be of various shapes or dimensions. For example, the diameter of the via 220 can be the same or different over the depth of the via 220 or can have steps.

At the process 320, the copper interconnects are formed in vias created by the process 310. The simplified diagram in FIG. 4A also shows the process 320 for forming copper interconnects according to an embodiment of the present invention. This diagram is merely an example, which should not unduly limit the scope of the claims. One of ordinary skill in the art would recognize many variations, alternatives, and modifications. For example, forming copper interconnect 230 in via 220 is implemented in the device 200.

A metal barrier layer 225 is deposited to coat the surfaces of the vias 220. In one embodiment, the barrier layer 225 is TaN. On the metal barrier layer 225, the copper material is deposited to at least partially fill the vias 220. The deposition of the copper material can be performed by various techniques. In an embodiment, the copper material is added by a chemical vapor deposition process and/or a sputtering process.

After the copper material at least partially fills the vias 220, the copper interconnects 230 for the integrated circuit are formed. For example, the formation of the copper interconnects 230 is assisted by photo-lithography processes. Subsequently, the top copper interconnects are processed for bond pad patterning. For example, the bond pad patterning is processed automatically by copper CMP without an additional mask. As shown in FIG. 4A, according to an embodiment, the process 320 yields a surface including a top copper interconnect 230 that will be used for bond pad and those not used for bond pads.

At the process 330, a dielectric layer is deposited on top of the surface prepared in process 320 and then patterned. FIG. 4B is a simplified diagram showing a method for depositing and patterning a second dielectric layer for forming conductive bumping with copper interconnection according to an embodiment of the present invention. This diagram is merely an example, which should not unduly limit the scope of the claims. One of ordinary skill in the art would recognize many variations, alternatives, and modifications.

Referring to FIG. 4B, in one embodiment of the present invention, the dielectric layer 250 includes two sub-layers 251 and 252. For example, the sub-layer 251 is formed by the passivation of oxide or silicon-rich oxide on the surface of copper interconnects 230. The sub-layer 252 is subsequently formed by the passivation SiON or Nitride or bisbenzocyclobutene (BCB) or Polyimide. According to a preferred embodiment of the invention, the sub-layer 252 is BCB due to its desired properties of low dielectric constant (2.7) and low water absorption.

The dielectric layer 250 is then patterned by using a photoresist layer according to an embodiment of the present invention. For example, the photoresist layer is deposited and then exposed with a photolithography mask applied. The resist in the exposed region is washed out to form an opening that reveals a surface region of the dielectric layer 250. The resist layer opening is designed to center-align with the copper interconnects 230 to be used for bond pads. In one embodiment, the photoresist layer is a positive resist. In another embodiment, the photoresist is a negative resist.

Referring to FIG. 4B, according to an embodiment of the present invention, dielectric material is etched from the surface region of the dielectric layer 250 that is exposed by the resist layer opening. For example, the dry etching is performed to remove the dielectric layer 250. In one embodiment, the etching is highly anisotropic so that material of dielectric layer 250 is removed vertically much faster than laterally. In another embodiment, the etching is performed through the whole thickness of the dielectric layer 250 then is stopped at the top surface of the copper interconnects 230 by a pre-applied etch-stop layer. After removing the debris of the resist layer, via 260 is formed in the dielectric layer 250. For example, by controlling the resist layer patterning and etching process parameters, the just formed via 260 is located on the copper interconnects 230 to be used for bond pads. The via 260 has a depth equal to the thickness of the dielectric layer 250 and a cross-sectional dimension equal to or larger than that of the copper interconnects 230.

At the process 340, a metal diffusion barrier layer is formed. FIG. 4C is a simplified diagram showing a method for forming a diffusion barrier layer for forming conductive bumping with copper interconnection according to an embodiment of the present invention. This diagram is merely an example, which should not unduly limit the scope of the claims. One of ordinary skill in the art would recognize many variations, alternatives, and modifications.

As shown in FIG. 4C, the diffusion barrier layer 280 overlays the whole surface including the bottom surface of the via 260, the side surface within the via 260, and the top surface of the dielectric layer 250. The deposition of the diffusion barrier layer 280, according to one embodiment of the present invention, can be performed by PVD. According to some embodiments of the invention, the diffusion barrier layer 280 may be at least one material layer selected from a group consisting of Ta, TaN, TaN/Ta, TiN, TiSiN, W, TiW, and WN. In yet another embodiment, the diffusion barrier layer 280 includes a gold seed layer. The deposition of the diffusion barrier layer 280 can be also performed by various techniques. For example, the diffusion barrier layer 280 is formed by a chemical vapor deposition process and/or atomic layer deposition.

At the process 350, a resist layer is coated and patterned. FIG. 4D is a simplified diagram showing a method for coating and patterning resist layer for forming conductive bumping with copper interconnection according to an embodiment of the present invention. This diagram is merely an example, which should not unduly limit the scope of the claims. One of ordinary skill in the art would recognize many variations, alternatives, and modifications.

Referring to FIG. 4D, a photoresist layer 285 is coated on top of the diffusion barrier layer 280. For example, the resist layer 285 is patterned by exposure through a photolithography mask pre-aligned with via 260. After developing the resist layer 285 and removing the portions that were exposed, an opening of the resist layer 285 is formed to locate right over via 260. The shape of the opening is similar to that of via 260 and the lateral dimension can be bigger so that the sidewall of the resist opening is outside the rim of via 260. In one embodiment, the photoresist layer 285 is a positive resist. In another embodiment, the photoresist 285 is a negative resist. The resist opening plus the via 260 create a cavity for forming the bumping pad in later process. In yet another embodiment, the thickness of the resist layer 285 is pre-determined to ensure the bumping pad to be formed has a desired height above via 260.

Figure 4E:
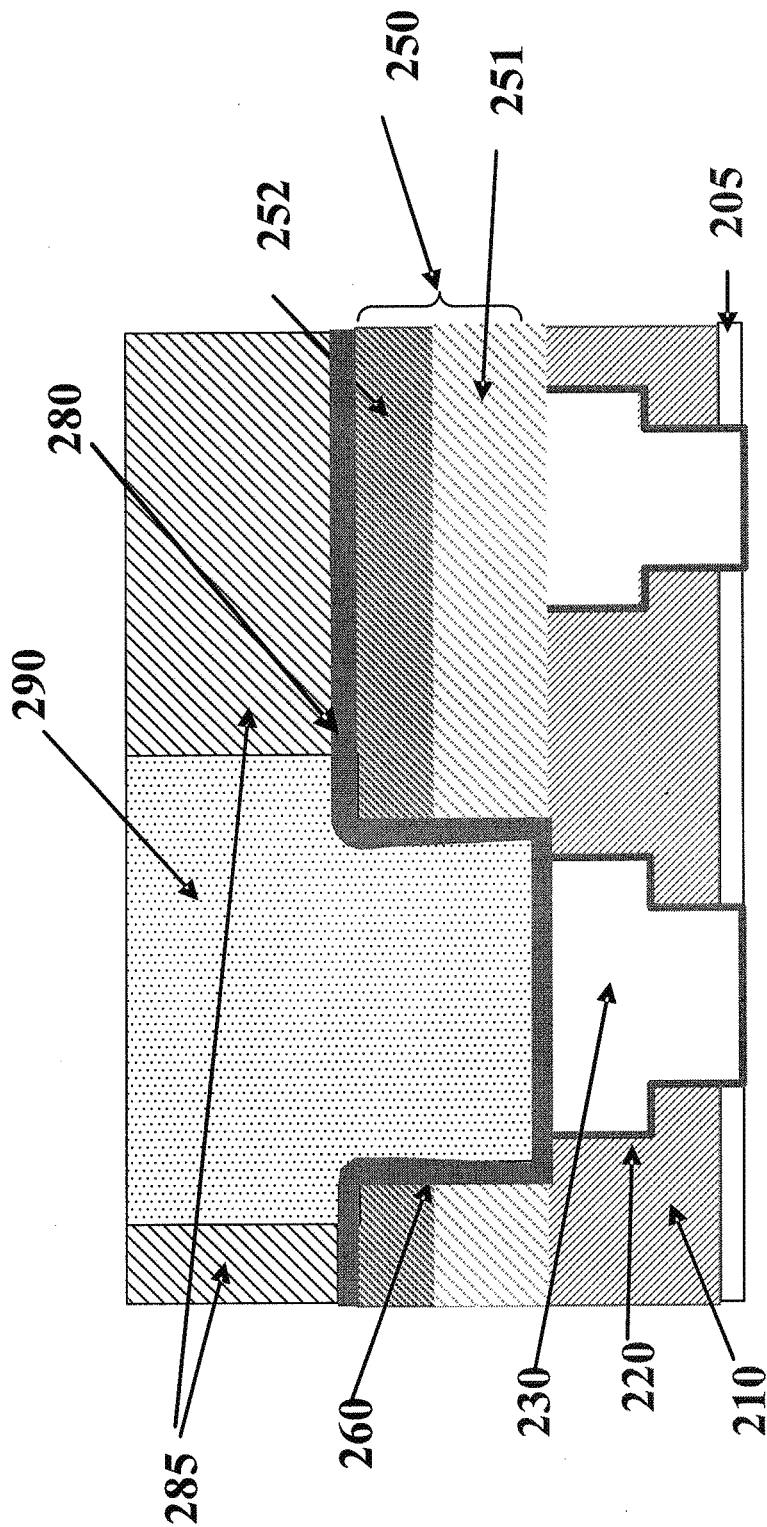

At the process 360, gold plating is performed. FIG. 4E is a simplified diagram showing a method for gold plating for forming conductive bumping with copper interconnection according to an embodiment of the present invention. This diagram is merely an example, which should not unduly limit the scope of the claims. One of ordinary skill in the art would recognize many variations, alternatives, and modifications.

Referring to FIG. 4E, to form a bumping pad conductively connecting copper interconnects, a gold material 290 is deposited to fill the cavity created at process 350 from the bottom of the via 260 up to the surface of the resist layer 285. In one example, gold material 290 is deposited by an electroplating technique. In another example, prior to the gold plating a low-power oxygen plasma ash is applied to remove potential residue of the resist in the areas to be plated. According to certain embodiments of the present invention, although gold material is shown to be used for forming the bumping pad, there can be many alternatives for the pad material. For example, the pad material may be selected from a group consisting of copper, nickel, gold, and silver. In another embodiment, the electroplating technique can be replaced by PVD or CVD. Referring to FIG. 4E, according to an embodiment of the present invention, the gold material in the via 260 is conductively connected with copper interconnects 230 at the bottom of via 260 through a diffusion barrier 280.

Figure 4F:
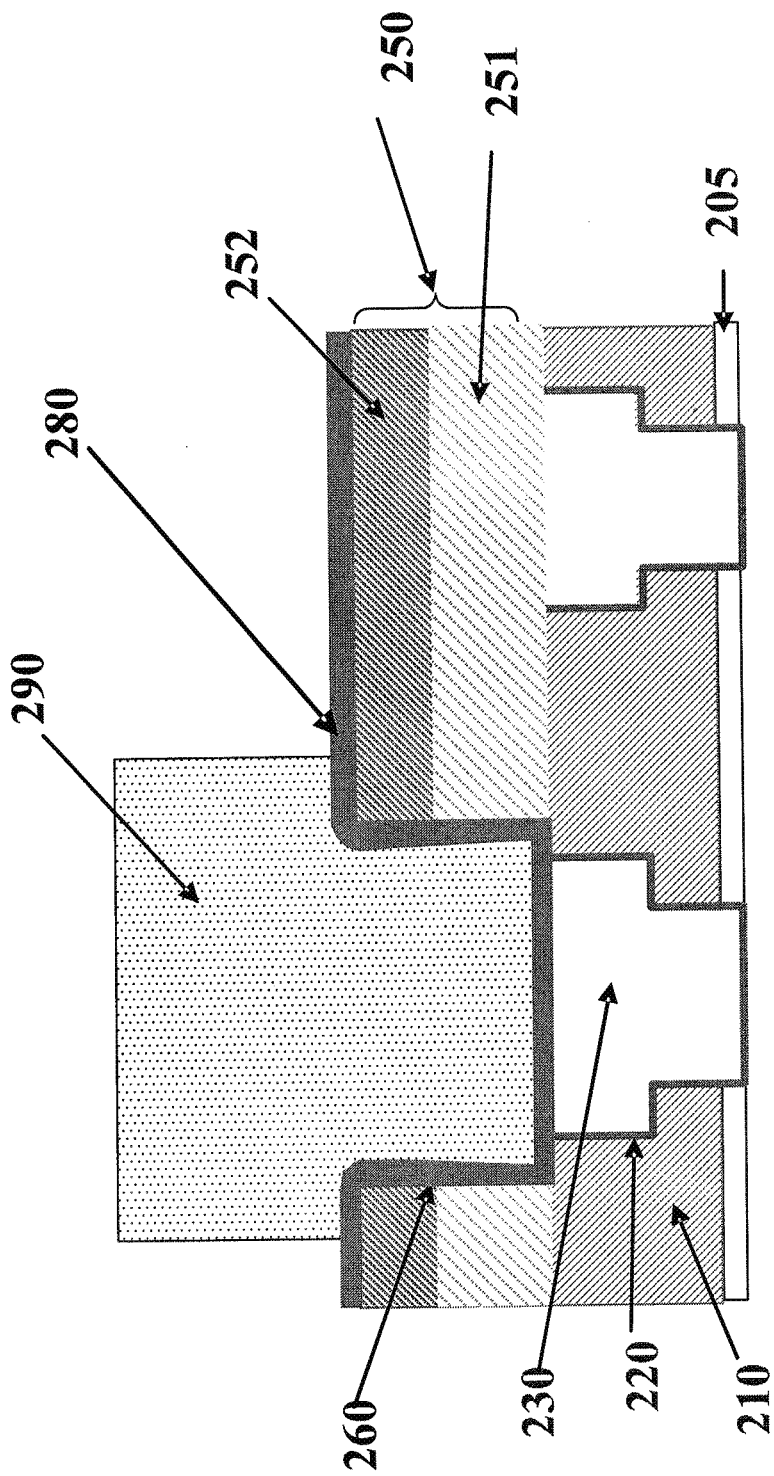

At the process 370, the resist layer is stripped. Additionally, the diffusion barrier layer 280 outside the rim of via 260 that is not covered by the gold material 290 is etched away. FIG. 4F is a simplified diagram showing a method for resist stripping and metal etching for forming conductive bumping with copper interconnection according to an embodiment of the present invention. This diagram is merely an example, which should not unduly limit the scope of the claims. One of ordinary skill in the art would recognize many variations, alternatives, and modifications.

For example, the resist layer 285 (shown in FIG. 4E) on top of the metal diffusion barrier layer 280 is stripped by organic stripping employing organic strippers. The organic stripper in one example can be phenol-based organic stripper. In another example, the organic stripper can be low-phenol or phenol-free organic stripper. An $O_2$ plasma stripping process may be followed.

At the process 370, the diffusion barrier layer 280 outside the rim of via 260 that is not covered by the gold material is etched away. The etching of the diffusion barrier layer 280 can be performed by various techniques. In one embodiment, the etching of the diffusion barrier layer 280 is accomplished by reactive ion etching which uses both physical sputtering and chemically reactive species to remove the metal layers. In one example, if gold seed layer was deposited before the diffusion barrier layer deposition, this gold seed layer can be removed by reverse plating. In another example, a dilute gold wet etch chemistry is applied to remove gold particles. In another embodiment, the etching of the diffusion barrier layer 280 can be performed with plasma etching. In one example, the plasma etch is performed in a residue-free etching process.

After the etching process to remove the diffusion barrier layer 280 that is not covered by the gold material, the underlying surface of the dielectric layer 250 is revealed. Referring to FIG. 4F, according to an embodiment of the present invention, up to this stage of the process 370 an initial form of a gold pad 290 with a certain height above a dielectric layer 250 is formed. The gold pad 290 is in contact with the diffusion barrier layer 280 at the bottom and all sidewalls of the via 260 including a portion outside the rim of the via 260.

At the process 370, thermal annealing is performed to the integrated circuit system, including the just formed gold pad 290 in its initial form. In one example, the thermal annealing is performed by a remote plasma activated process at the relatively low temperature 200° C. to 600° C. Through the mass transportation the annealing process at least partially reshapes the gold pad 290 above the surface of the dielectric layer 250, making it ready for conductive bumping process.

Figure 4G:
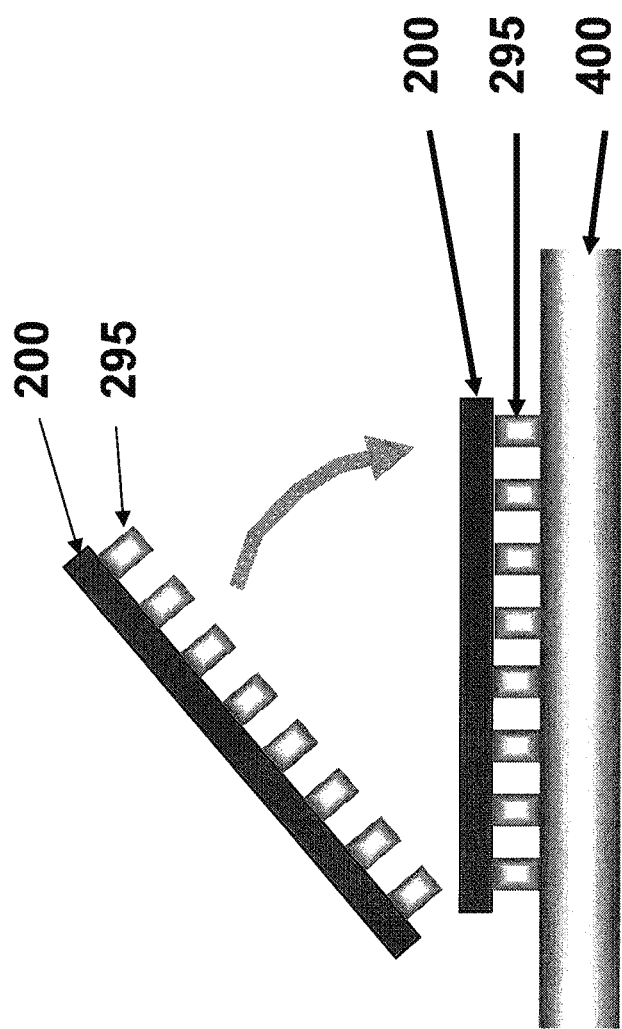

At process 380, conductive bumping contact with a substrate is formed. FIG. 4G is a simplified diagram showing a process for forming conductive bumping with copper interconnection according to an embodiment of the present invention. This diagram is merely an example, which should not unduly limit the scope of the claims. One of ordinary skill in the art would recognize many variations, alternatives, and modifications. For example, the conductive bump used in the process is made from the gold pad 290 formed at the end of the process 370.

Referring to FIG. 4G, according to an embodiment of the present invention, an integrated circuit system 200 with one or more copper interconnects including one or more conductive bumps 295 is formed. A substrate 400 is provided. The flip chip bumping process is then performed to create one or more conductive contacts between the substrate and the integrated circuit system 200 with one or more copper interconnects through one or more conductive bumps 295. In one embodiment, the conductive bumps are made from the gold pad 290 formed at the process 370. In another embodiment, the bumping process is a lead free gold bumping process. According to certain embodiments of the present invention, the substrate 400 may be various types. For example, the substrate 400 can be a PCB board. In another example, the substrate 400 is an interposer or a glass substrate. In another embodiment of the invention, the substrate material can be organic or ceramic.

Many benefits are achieved by way of the present invention over conventional techniques. For example, in lead free flip chip gold bumping process, the present technique provides a replacement of the aluminum wire bonding by gold bumping. In another example, the present technique provides a full copper interconnection for the gold bumping process without aluminum material for the whole process. Some embodiments of the present invention provide an integrated circuit system with one or more copper interconnects without aluminum material. Certain embodiments of the present invention provide a process that is compatible with conventional process technology. Moreover, the process does not require an additional mask for patterning the copper bond pad. Some embodiments of the present invention utilize copper CMP process to automatically patterning the copper bond pad. Certain embodiments of the present invention reduce the possibility of the cross contamination between aluminum and copper. Some embodiments of the present invention improve the speed of the whole chip.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making an integrated circuit system with one or more copper interconnects, the one or more copper interconnects being conductively connected with a substrate, the method comprising:
    depositing and patterning a first dielectric layer to form a first via;
    filling the first via through the first dielectric layer with a copper material;
    depositing and patterning a second dielectric layer in contact with the first dielectric layer to form a second via;
    forming a diffusion barrier layer, the diffusion barrier layer at least partially filling the second via through the second dielectric layer, at least a first part of the diffusion barrier layer in direct contact with the copper material, at least a second part of the diffusion barrier layer in direct contact with the second dielectric layer;
    depositing and patterning a photoresist layer on the diffusion barrier layer;
    at least partially filling the second via with a metal material, the metal material being conductively connected to the copper material through the diffusion barrier layer; and
    conductively connecting the metal material with the substrate,
    wherein the metal material comprises gold, silver, nickel, or copper.

2. The method of claim 1, wherein the first dielectric layer can be fluorinated silica glass (FSG) or carbonized silicon dioxide.

3. The method of claim 1, wherein the second dielectric layer comprises a first sub-layer and a second sub-layer; wherein the first sub-layer is passivation oxide or silicon rich oxide (SRO) and the second sub-layer overlaying the first sub-layer is passivation SiON, Nitride, benzocyclobutene (BCB) or polyimide.

4. The method of claim 3, wherein the first sub-layer is first deposited and the second sub-layer is deposited on top of the first sub-layer.

5. The method of claim 1, wherein the diffusion barrier layer comprises at least one material layer selected from a group consisting of Ta, TaN, TaN/Ta, TiN, TiSiN, W, TiW, and WN.

6. The method of claim 1 further comprising forming a barrier layer on the inner surface of the first via before filling copper material.

7. The method of claim 6, wherein the barrier layer comprises TaN.

8. The method of claim 1 further comprising an annealing process at a temperature between 200° C. and 600° C.

9. The method of claim 1, wherein the substrate is a PCB board, an interposer, or a glass substrate.

10. The method of claim 1, wherein the diffusion barrier layer comprises a metal seed layer comprising gold, silver, nickel, or copper.

11. The method of claim 10, wherein the metal seed layer is deposited after the deposition of the diffusion barrier layer.

* * * * *